(12) United States Patent
Harun et al.

(10) Patent No.: US 7,261,230 B2
(45) Date of Patent: Aug. 28, 2007

(54) WIREBONDING INSULATED WIRE AND CAPILLARY THEREFOR

(75) Inventors: Fuaida Harun, Selangor (MY); Chiaw Mong Chan, Selangor (MY); Lan Chu Tan, Selangor (MY); Lau Teck Beng, Kuala Lumpur (MY); Kong Bee Tiu, Selangor (MY); Soo San Yong, Selangor (MY)

(73) Assignee: Freescale Semiconductor, Inc., Austin, TX (US)

( * ) Notice: Subject to any disclaimer, the term of this patent is extended or adjusted under 35 U.S.C. 154(b) by 618 days.

(21) Appl. No.: 10/652,434

(22) Filed: Aug. 29, 2003

(65) Prior Publication Data

US 2005/0045692 A1 Mar. 3, 2005

(51) Int. Cl.
*B23K 1/06* (2006.01)
(52) U.S. Cl. ............... 228/110.1; 228/111; 228/164; 228/170; 228/180.5; 156/73.2
(58) Field of Classification Search ............ 228/110.1, 228/111, 164, 170, 172, 173.1, 173.5, 265, 228/180.5; 156/73.1, 73.2
See application file for complete search history.

(56) References Cited

U.S. PATENT DOCUMENTS

| | | | |
|---|---|---|---|
| 3,750,926 A * | 8/1973 | Sakamoto et al. | ........... 228/1.1 |
| 5,476,211 A | 12/1995 | Khandros | |
| 5,601,740 A | 2/1997 | Eldridge et al. | |
| 5,842,628 A | 12/1998 | Nomoto et al. | |
| 6,073,827 A | 6/2000 | Razon et al. | |
| 6,321,969 B1 | 11/2001 | Miller | |
| 6,354,479 B1 | 3/2002 | Reiber et al. | |
| 6,497,356 B2 | 12/2002 | Miller et al. | |
| 6,523,733 B2 | 2/2003 | Miller et al. | |
| 6,854,637 B2 * | 2/2005 | Harun et al. | ............ 228/180.5 |

FOREIGN PATENT DOCUMENTS

| | | | |
|---|---|---|---|
| JP | 54159683 A | * | 12/1979 |
| JP | 01261838 A | * | 10/1989 |
| JP | 01264234 A | * | 10/1989 |

OTHER PUBLICATIONS

Translation of JP 01261838 A.*

* cited by examiner

*Primary Examiner*—Steven Bos
*Assistant Examiner*—Paul Wartalowicz
(74) *Attorney, Agent, or Firm*—Charles Bergere

(57) ABSTRACT

An improved method of bonding an insulated wire (14) that has one end connected to a first bond pad (16) to a second bond pad (18) includes moving a tip of a capillary (20) holding the bond wire (14) over the surface of the second bond pad (18) such that the bond wire (14) is rubbed between the capillary tip (20) and the second bond pad (18), which tears the bond wire insulation so that at least a portion of a metal core of the wire (14) contacts the second bond pad (18). The wire (14) is then bonded to the second pad (18) using thermocompression bonding. The tip of the capillary (20) is roughened to enhance the tearing of the bond wire insulation.

22 Claims, 1 Drawing Sheet

WIREBONDING INSULATED WIRE AND CAPILLARY THEREFOR

BACKGROUND OF THE INVENTION

The present invention relates to wires for connecting integrated circuit (IC) die to leads and wirebonding, and more particularly, to a method of wirebonding insulated wires.

An IC die is a small device formed on a semiconductor wafer, such as a silicon wafer. Such a die is typically cut from the wafer and attached to a substrate or base carrier for interconnect redistribution. Bond pads on the die are electrically connected to leads on the substrate with wires via wire bonding. Wires may also be used to cross connect bond pads of the die or to cross connect leads of the substrate. The die, wires and substrate are then encapsulated to form a packaged device.

There is a continuing demand for more dense integrated circuits, yet without a corresponding increase in the size or footprint of the packaged device. There is also a desire for more inputs and outputs to ICs, resulting in high densities of connections between the IC die and the substrate, and the need for fine pitch and ultra-fine pitch wire bonding. The diameter of the bond wire also has decreased. For example, 63 um pitch applications use 25 um diameter wire, while 52 um and 44 um pitch applications use 20.3 um diameter wire. Development is being done for a 37 um pitch application using 17 um diameter wire.

Decreases in pitch and wire diameter cause difficulties in handling and wire bonding. For example, wires may unintentionally short to other conductive structures of the packaged device, such as other wires, pads, leads, or the die. This shorting may occur during IC die encapsulation as, for example, from "sweeping," where the injection or transfer of the liquid molding encapsulant moves the wires against another conductive structure. Parts that use smaller diameter wires tend to have higher wire sweep rejects. Using insulated or coated wires may decrease such wire sweep and shortings. However, it is difficult to obtain good bonding quality when using coated wires, especially for the second bond. That is, a wirebonder makes a first bond at the die bond pad and a second bond at the carrier lead. Non-sticking on the lead is a common problem with insulated wire. One attempt at overcoming the weak second bond was to remove the insulator using an electric flame off (EFO). However, performing EFO at the second bond requires a special wirebonding machine and takes additional time.

The present invention provides a method of wire bonding insulated or coated wire using a standard wirebonder that improves the bonding quality of the second bond.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there are shown in the drawings embodiments that are presently preferred. It should be understood, however, that the invention is not limited to the precise arrangements and instrumentalities shown. In the drawings.

DETAILED DESCRIPTION OF PREFERRED EMBODIMENTS

Figure 1:
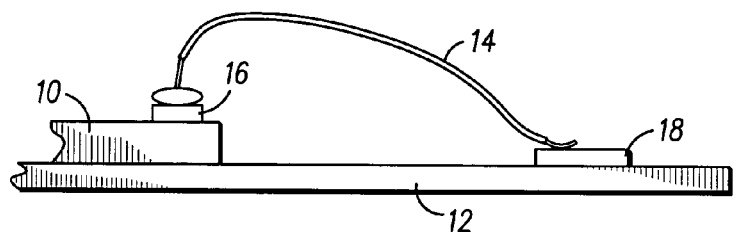
FIG. 1 is an enlarged side view of an electrical connection in accordance with the present invention.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the spirit and scope of the invention.

Certain features in the drawings have been enlarged for ease of illustration and the drawings and the elements thereof are not necessarily in proper proportion. However, those of ordinary skill in the art will readily understand such details. In the drawings, like numerals are used to indicate like elements throughout.

The present invention provides a method of electrically connecting a first device to a second device with an insulated wire. The method includes the steps of:

forming a first bond by wirebonding a first end of the insulated wire to a first bond pad of the first device, thereby electrically connecting the bond wire and the first device;

moving a tip of a capillary holding the bond wire over the surface of second bond pad of the second device such that the bond wire is rubbed between the capillary tip and the second bond pad, thereby tearing the bond wire insulation so that at least a portion of a metal core of the wire contacts the second bond pad; and bonding at least the exposed portion of the bond wire to the second bond pad via thermocompression bonding, thereby electrically connecting the first device and the second device.

The present invention also is a capillary for a wirebonder in which the capillary has a cylindrical tip through which a bond wire protrudes, wherein an outer surface of the capillary is roughened for tearing an insulative coating on a coated wire.

Referring now to FIG. 1, an enlarged, partial side view of a first device 10 attached to a second device 12 with a coated or insulated wire 14, prior to encapsulation. The first device 10 may be a semiconductor device such as an integrated circuit formed on a silicon substrate. The second device 12 may also be a semiconductor device, such as a bottom or lower die in a stacked die configuration. However, in the presently preferred embodiment, the second device 12 is a carrier or substrate. More particularly, FIG. 1 shows a die bonding pad 16 of the first device electrically connected to a lead finger 18 of the second device 12, which in this case is a leadframe. The first and second devices 10, 12 and their bond pads 16, 18 are of a type known to those of ordinary skill in the art and detailed descriptions thereof are not necessary for a full understanding of the invention.

The insulated bond wire 14 of the present invention comprises a conductive core coated with an electrically insulating material and is suitable for fine pitch and ultra-fine pitch wirebonding. The insulating material prevents the wire from shorting to other wires or other conductive structures. In general, gold and aluminum are the most commonly used elements to make the conductive core of the bonding wire 14. Both gold and aluminum are strong and ductile and have similar resistance in most environments. Gold wire is sometimes doped with a dopant, such as beryllium, calcium in order to stabilize it. Small-diameter aluminum wire is often doped with silicon or sometimes magnesium to improve its breaking load and elongation parameters. In addition to gold and aluminum, copper, palladium-alloy, platinum and silver bonding wire are also known. As is known by those of skill in the art, various size wires are available for connecting die to substrates, with the wire size being selected based on, among other things, pad pitch. The bond wire 14 has a diameter of between about 15 um to about 55 um, although other diameter bond wires may be used and the invention should not be limited to a particular bond wire diameter. In a preferred embodiment, the insulated wire 14 has a diameter of less than about 25 um. The insulative coating preferably is an organic insulative coating having a thickness of about 0.5 um to about 2.0 um that can be thermally decomposed during free air ball formation. Further, the wire 14 preferably has a melting temperature (Tg) of about 180° to 350° C.

The connection of the wire 14 at the die bonding pad 16 is referred to herein as a first bond and the connection of the wire 14 at the lead finger 18 as a second bond. In the presently preferred embodiment, the first bond is a ball bond and the second bond is a wedge bond. The term 'wirebonding' is generally accepted to mean the interconnection, via wire, of chips and substrates. In ball bonding, a capillary holds the wire. A ball is formed on one end of the wire and is pressed against the face of the capillary. The ball may be formed with a hydrogen flame or a spark. The capillary pushes the ball against the bond pad, and then, while holding the ball against the first pad, ultrasonic vibration is applied, which bonds the ball to the die. Once the ball is bonded to the die pad, the capillary, which is still holding the wire, is moved over a second bonding pad, such as the lead frame finger 18, to which the first pad is to be electrically connected. The wire is pressed against the second pad and once again ultrasonic energy is applied until the wire is bonded to the second pad. The capillary is then lifted off the bond, breaking free from the wire. Both wedge bonding and ball bonding are well known by those of skill in the art.

Although wedge bonding is well known, it is difficult to obtain a good second wire bond when using insulated wire. Oftentimes the weak second bond is due to the wire insulation still existing between the wire and the bonding lead, preventing good adhesion. That is, there is only a small contact area between the wire and the lead, which is at a tail area of the second bond. On the opposite side of the wire, a greater portion of the insulator is taken away during wedge formation. The weak adhesion is evidenced in wire peel test results. In a wire peel test, a hook is placed under the wire proximate to the second bond and a lifting force is applied, thereby testing the strength of the second bond adhesion to the lead/post. Insulated fine wire and insulated ultra-fine wire usually exhibit very low wire peel strength. To overcome the low wire peel strength problem, the present invention provides a method of wedge bonding an insulated wire including a mechanical abrasion step that involves moving a tip of a capillary holding the bond wire over the surface of second bond pad such that the bond wire is rubbed between the capillary tip and the second bond pad, thereby tearing the bond wire insulation so that at least a portion of the metal core of the wire contacts the second bond pad. In the preferred embodiment, a special, roughened capillary tip is used to enhance the mechanical abrasion.

Figure 2A:
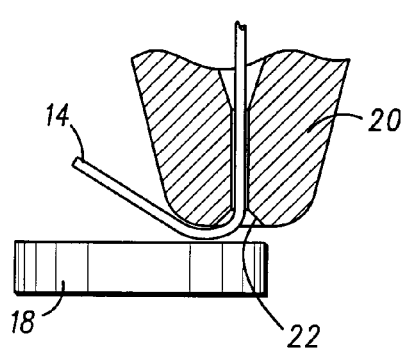
FIGS. 2A-2C are cross-sectional views of a wire bonder capillary illustrating a method of bonding an insulated wire to a bond pad in accordance with an embodiment of the present invention.
Figure 2B:
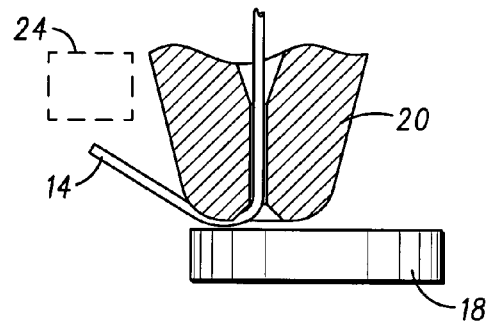
Figure 2C:
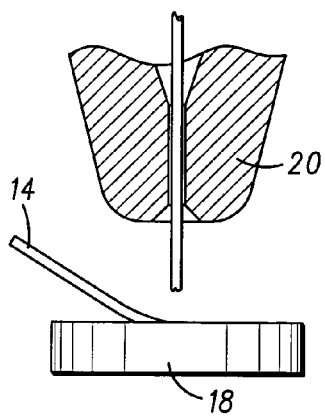

Referring now to FIGS. 2A to 2C, cross-sectional views of a wire bonder capillary 20 illustrating a method of bonding an insulated wire 14 to a lead finger 18 in accordance with an embodiment of the present invention are shown. The wire 14 extends through a hole 22 in the capillary 20. FIG. 2A shows the wire 14 being pressed against the lead finger 18 by the capillary 20. According to the present invention, the capillary 20 is then moved horizontally over the surface of the lead finger 18 such that the bond wire 14 is rubbed between a tip of the capillary 20 and the lead finger 18. FIG. 2B shows the wire 14 after it has been moved from right to left across the lead finger 18. Such movement of the wire 14 against the lead finger 18 causes a tearing of the bond wire insulation so that at least a portion of the metal core of the wire 14 contacts the lead finger 18. After moving the bond wire 14 across the lead finger 18, thermocompression bonding is performed to bond the wire 14 to the lead finger 18, thereby electrically connecting the first device 10 and the second device 12. The wire 14 may be moved back and forth one or more times over the lead finger 18 in order to achieve an amount of mechanical abrasion needed to tear the insulative coating on the wire 14. In the presently preferred embodiment, the wire 14 is moved two to three times horizontally in such a way that the capillary movement has a combination of a positive shift movement (away from the second bond location) and two negative shift movements (towards the second bond location) over the surface of the lead finger 18 before any thermocompression, thermosonic or ultrasonic wirebonding step is performed. The amount of energy required for ultrasonic bonding is very low and is about the minimum amount of ultrasonic energy used for ultrasonic bonding. FIG. 2C shows the capillary 20 being lifted off the bond pad 18, after the mechanical movement and the thermocompression bonding. The lifting of the capillary 20 breaks the wire 14 at the bond.

The thermocompression bonding step includes a combination of heat and pressure to attach the wire 14 to the lead finger 18. Either a heated capillary or a heated pedestal (not shown) on which the lead frame is located or both may be used to generate heat. In the present invention, the temperature ranges from 100° C. to 200° C. The wirebonding may be performed using currently available wirebonders, such as the such as the ESEC 3088 iP and the Kulicke & Soffa 8060, with only modifications to the capillary tip required, as described below. In an optional embodiment, the lead finger 18 may be heated with a local heat source 24 prior to the moving of the wire 14 against the lead finger 18 in order to increase the effectiveness of insulation tearing by the mechanical movement described above.

Figure 3:
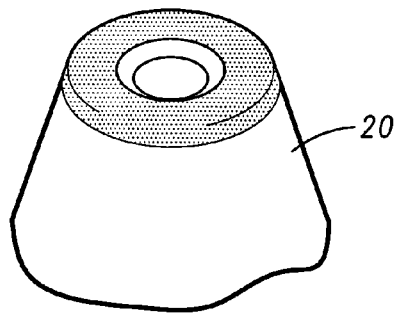
FIG. 3 is an enlarged perspective view of a capillary tip in accordance with an embodiment of the present invention.

Referring now to FIG. 3, a greatly enlarged perspective view of the tip of the capillary 20 is shown. As shown in the drawing, the capillary 20 may have a cylindrical tip with a hole through which the bond wire protrudes. The capillary may be made from ceramic, tungsten or ruby materials, as are typically used. However, where a typical capillary has a polish finish to produce a shiny bond, according to the present invention, the tip of the capillary 20 is roughened in order to enhance abrasion of the insulation during the moving step. More particularly, the outer surface of the capillary 20 is roughened and has a roughness of between about two to five times the surface roughness of current capillaries.

The present invention has been found to provide the following advantages: (a) near elimination of rejection of parts due to Non-Stick on Lead at the second bond when using insulated wire with a standard wirebonding machine;

(b) enhancing the bondability of insulated wire at the second bond with an increased wire pull/wire peel strength; (c) new or modified wirebonding equipment is not required except for the capillary tip; (d) wire shorting rejects at mold have been decreased; (e) an expensive mold compound having a very fine filler is not required; (f) the use of fine coated wire enables cross bonding; (g) the pad/die design rules do not need to be restricted to peripheral pads only; and (h) decrease in electrical open short rejects.

The description of the preferred embodiment of the present invention has been presented for purposes of illustration and description, but is not intended to be exhaustive or to limit the invention to the form disclosed. It will be appreciated by those skilled in the art that changes could be made to the embodiment described above without departing from the broad inventive concept thereof. The present invention is applicable to all wire bonded package types, including but not limited to Ball Grid Array (BGA), Tape Ball Grid Array (TBGA), Plastic Ball Grid Array (PBGA), Quad Flat No-lead (QFN), Quad Flat Package (QFP), Small Outline Integrated Circuit (SOIC), and chip scale package (CSP). In addition, wires having insulator coatings may also be used to connect other types of conductive structures in a packaged IC. It is understood, therefore, that this invention is not limited to the particular embodiment disclosed, but covers modifications within the spirit and scope of the present invention as defined by the appended claims.

The invention claimed is:

1. A method of electrically connecting a first device to a second device with an insulated wire, the method comprising the steps of:
   forming a first bond by wirebonding a first end of the insulated wire to a first bond pad of the first device, thereby electrically connecting the bond wire and the first device;
   moving a tip of a capillary holding the bond wire over the surface of second bond pad of the second device such that the bond wire is rubbed between the capillary tip and the second bond pad horizontally thereby tearing the bond wire insulation so that at least a portion of a metal core of the wire contacts the second bond pad, wherein the capillary has a roughened tip that enhances abrasion of the insulation during said moving step; and
   bonding at least the exposed portion of the bond wire to the second bond pad via thermocompression bonding, thereby electrically connecting the first device and the second device.

2. The electrical connection method of claim 1, wherein the moving step includes moving the capillary tip such that the capillary movement has a combination of a positive shift movement in a first direction over the second bond pad and a negative shaft movement move in a second direction over the second bond pad.

3. The electrical connection method of claim 1, wherein the bonding step includes thermocompression bonding and a very low amount of ultrasonic energy.

4. The electrical connection method of claim 1, wherein the first bond comprises a ball bond.

5. The electrical connection method of claim 4, wherein the second bond comprises a stitch bond.

6. The electrical connection method of claim 1, wherein the second device comprises a carrier and the second bond pad is a lead finger.

7. The electrical connection method of claim 1, further comprising the step of heating the second bond pad prior to said moving step.

8. The electrical connection method of claim 1, wherein the insulated wire comprises one of a gold, copper or aluminum wire having an organic insulative coating.

9. The electrical connection method of claim 8, wherein the insulated wire has a diameter of less than about 25 um.

10. The electrical connection method of claim 9, wherein the insulative coating has a thickness of about 0.5 um to 2.0 um.

11. An improved method of bonding an insulated wire having one end connected to a first bond pad to a second bond pad, the improved method comprising the steps of:
    moving a tip of a capillary holding the bond wire over the surface of the second bond pad such that the bond wire is rubbed between the capillary tip and the second bond pad, thereby tearing the bond wire insulation so that at least a portion of a metal core of the wire contacts the second bond pad, wherein the capillary has a roughened tip that enhances abrasion of the insulation during said moving step; and
    bonding the exposed portion of the bond wire to the second bond pad via thermocompression bonding.

12. The electrical connection method of claim 11, wherein the moving step includes moving the capillary tip such that the capillary movement has a combination of a positive shift movement in a first direction over the second bond pad and a negative shift movement move in a second direction over the second bond pad.

13. The electrical connection method of claim 11, wherein the thermocompression bonding uses a very small amount of ultrasonic energy.

14. The electrical connection method of claim 11, wherein the second bond comprises a stitch bond.

15. The electrical connection method of claim 14, wherein the second bond pad comprises a carrier finger.

16. The electrical connection method of claim 11, further comprising the step of heating the second bond pad prior to said moving step.

17. The electrical connection method of claim 11, wherein the insulated wire comprises one of a gold, copper or aluminum wire having an organic insulative coating.

18. The electrical connection method of claim 17, wherein the insulated wire has a diameter of less than about 25 um and the insulative coating has a thickness of about 0.5 um to 2.0 um.

19. An improved method of bonding an insulated wire having one end connected to a first bond pad to a second bond pad, the improved method comprising the steps of:
    providing a capillary having a roughened tip for holding the insulated wire;
    moving the tip of the capillary over a surface of the second bond pad such that the wire is rubbed between the capillary tip and the second bond pad, thereby tearing the insulation so that at least a portion of a metal core of the wire contacts the second bond pad; and
    bonding the exposed portion of the wire to the second bond pad via thermocompression bonding.

20. The electrical connection method of claim 19, further comprising the step of heating the second bond pad prior to said moving step.

21. The electrical connection method of claim 19, wherein the insulated wire comprises one of a gold, copper or aluminum wire having an organic insulative coating.

22. The electrical connection method of claim 21, wherein the insulated wire has a diameter of less than about 25 um and the insulative coating has a thickness of about 0.5 um to 2.0 um.

* * * * *

UNITED STATES PATENT AND TRADEMARK OFFICE
CERTIFICATE OF CORRECTION

PATENT NO. : 7,261,230 B2  Page 1 of 1
APPLICATION NO. : 10/652434
DATED : August 28, 2007
INVENTOR(S) : Harun et al.

It is certified that error appears in the above-identified patent and that said Letters Patent is hereby corrected as shown below:

In Column 5, Line 52, Claim No. 2:

Change "shaft" to --shift--

Signed and Sealed this

Thirteenth Day of November, 2007

JON W. DUDAS
*Director of the United States Patent and Trademark Office*